United States Patent
Zhou (10) Patent No.: US 11,742,414 B2
(45) Date of Patent: Aug. 29, 2023

(54) SEMICONDUCTOR DEVICE WITH FINS

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 250 days.

(21) Appl. No.: 17/247,984

(22) Filed: Jan. 4, 2021

(65) Prior Publication Data
US 2021/0125876 A1    Apr. 29, 2021

Related U.S. Application Data

(62) Division of application No. 16/118,010, filed on Aug. 30, 2018, now Pat. No. 10,916,479.

(30) Foreign Application Priority Data

Nov. 23, 2017    (CN) .......................... 201711186310.7

(51) Int. Cl.
*H01L 29/66* (2006.01)
*H01L 21/762* (2006.01)
(Continued)

(52) U.S. Cl.
CPC .. *H01L 29/66795* (2013.01); *H01L 21/28008* (2013.01); *H01L 21/3065* (2013.01);
(Continued)

(58) Field of Classification Search
CPC ............... H01L 27/0886; H01L 29/785; H01L 29/66545; H01L 27/0924; H01L 29/41791; H01L 29/0649; H01L 29/6653; H01L 2029/7858; H01L 29/6656; H01L 21/823821; H01L 21/28008; H01L 21/3065; H01L 21/32135; H01L 21/76224; H01L 21/76232; H01L 21/823481; H01L 29/66795; H01L 21/31116; H01L 21/32137; H01L 21/823431
See application file for complete search history.

(56) References Cited

U.S. PATENT DOCUMENTS

10,096,598 B2    10/2018 Chang et al.
10,103,246 B2    10/2018 Cheng et al.
(Continued)

*Primary Examiner* — Shouxiang Hu
(74) *Attorney, Agent, or Firm* — Anova Law Group, PLLC (57) ABSTRACT

A semiconductor device is provided. The semiconductor device includes a semiconductor substrate; fins on the semiconductor substrate; an isolation layer formed on the semiconductor substrate and between adjacent fins; and gate structures on sides of the isolation layer. The isolation layer has a top surface higher than top surfaces of the fins and passes through the fins along a direction perpendicular to an extending direction of the fins and in parallel with a surface of the semiconductor substrate.

11 Claims, 7 Drawing Sheets

(51) Int. Cl.
*H01L 21/3065* (2006.01)
*H01L 21/3213* (2006.01)
*H01L 21/28* (2006.01)
*H01L 21/8234* (2006.01)
*H01L 21/8238* (2006.01)
*H01L 27/088* (2006.01)
*H01L 29/78* (2006.01)
*H01L 27/092* (2006.01)

(52) U.S. Cl.
CPC .. *H01L 21/32135* (2013.01); *H01L 21/76224* (2013.01); *H01L 21/76232* (2013.01); *H01L 21/823481* (2013.01); *H01L 21/823821* (2013.01); *H01L 27/0886* (2013.01); *H01L 27/0924* (2013.01); *H01L 29/6656* (2013.01); *H01L 29/66545* (2013.01); *H01L 29/785* (2013.01)

(56) References Cited

U.S. PATENT DOCUMENTS

| | | |
|---|---|---|
| 2017/0047226 A1 | 2/2017 | Cheng et al. |
| 2017/0117275 A1* | 4/2017 | Shen ............... H01L 21/823437 |
| 2017/0330957 A1 | 11/2017 | Cheng et al. |
| 2017/0358497 A1* | 12/2017 | Cheng ................ H01L 29/0649 |
| 2018/0005892 A1 | 1/2018 | Cheng et al. |

* cited by examiner

SEMICONDUCTOR DEVICE WITH FINS

CROSS-REFERENCES TO RELATED APPLICATION

This application is a divisional of U.S. patent application Ser. No. 16/118,010, filed on Aug. 30, 2018, which claims the priority of Chinese Patent Application No. 201711186310.7, filed on Nov. 23, 2017, the content of which is incorporated herein by reference in its entirety.

TECHNICAL FIELD

The present disclosure generally relates to the field of semiconductor technologies and more particularly, relates to a semiconductor device and its fabrication method.

BACKGROUND

A metal-oxide-semiconductor (MOS) transistor is one of the most important devices in modern integrated circuits. An elementary structure of the MOS transistor includes: a semiconductor substrate, gate structures on a surface of the semiconductor substrate, and source/drain doped regions in the semiconductor substrate on both sides of the gate structures. A gate structure includes a gate dielectric layer on a surface of the semiconductor substrate and a gate layer on a surface of the gate dielectric layer.

With continuous development in semiconductor technologies, conventional planar MOS transistors have a poor controlling ability on the channel current, which causes serious leakage current. A fin field effect transistor (FinFET) is an emerging multi-gate device. A FinFET usually includes fins protruding from the surface of the semiconductor substrate, gate structures covering a portion of top surfaces and sidewalls of the fins, source/drain doped regions in the fins on both sides of the gate structures.

However, conventional semiconductor devices formed by FinFETs have poor performance. The disclosed devices and methods are directed to at least partially alleviate one or more problems set forth above and to solve other problems in the art.

SUMMARY

One aspect of the present disclosure provides a fabrication method of a semiconductor device with improved isolation properties. The method includes: providing a semiconductor substrate; forming initial fins on the semiconductor substrate; forming a gate structure material layer on the semiconductor substrate and the initial fins, where the top surface of the gate structure material layer is higher than the top surfaces of the initial fins; forming a trench in the gate structure material layer and the initial fins, which passes through the initial fins along a direction perpendicular to an extending direction of initial fins and in parallel with a surface of the semiconductor substrate, and form initial fins into fins; forming an isolation layer in the trench, where the top surface of the isolation layer is higher than the top surfaces of the fins; and forming gate structures on both sides of the isolation layer by etching the gate structure material layer.

Another aspect of the present disclosure provides a semiconductor device. The semiconductor device includes: a semiconductor substrate; fins on the semiconductor substrate; an isolation layer in the fins; the top surface of the isolation layer may be higher than top surfaces of the fins; the isolation layer may pass through the fins along a direction perpendicular to an extending direction of the fins and in parallel with a surface of the semiconductor substrate; and gate structures on both sides of the isolation layer, wherein the gate structures cross the fins and cover a portion of top surfaces and sidewalls of the fins.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes: providing a semiconductor substrate; forming initial fins on the semiconductor substrate; forming a gate structure material layer on the semiconductor substrate and the initial fins, where the top surface of the gate material layer is higher than the top surfaces of the initial fins; forming a trench in the gate structure material layer and the initial fins, which passes through the initial fins along a direction perpendicular to an extending direction of initial fins and in parallel with a surface of the semiconductor substrate, and passes through the plurality of initial fins to form fins; forming an isolation layer in the trench, where the top surface of the isolation layer is higher than the top surfaces of the fins; forming gate structures on both sides of the isolation layer by etching the gate structure material layer, wherein the gate structures cross the fins and cover a portion of top surfaces and sidewalls of the fins. The isolation performance of the formed semiconductor devices may thus be improved.

FIGS. 1-5 illustrate semiconductor structures corresponding to certain stages for forming a semiconductor device.

Figure 1:
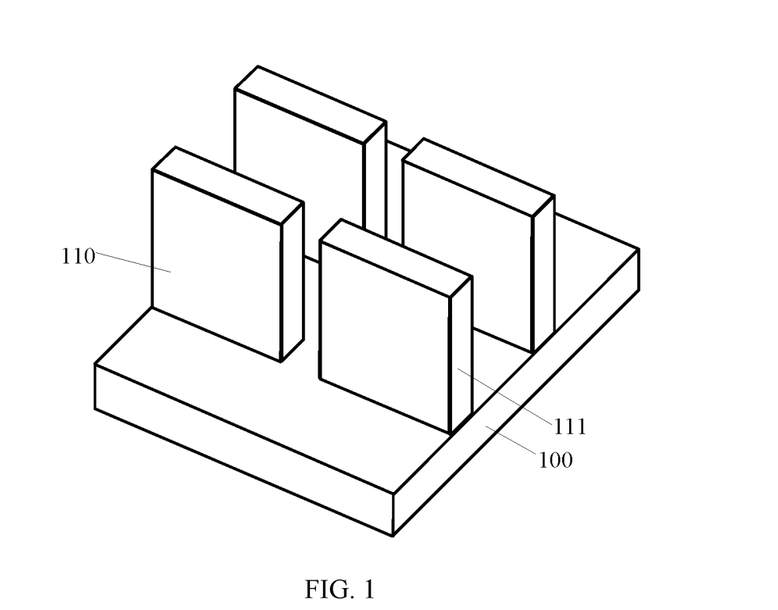
FIGS. 1-5 illustrate semiconductor structures corresponding to certain stages for forming a semiconductor device.

Referring to FIG. 1, a semiconductor substrate 100 with first fins 110 and second fins 111 on the semiconductor substrate 100 may be provided. The extending directions of the second fins 111 and the first fins 110 are in parallel with one another. An isolation region may be formed on the semiconductor substrate 100 between the first fins 110 and the second fins 111.

Figure 2:
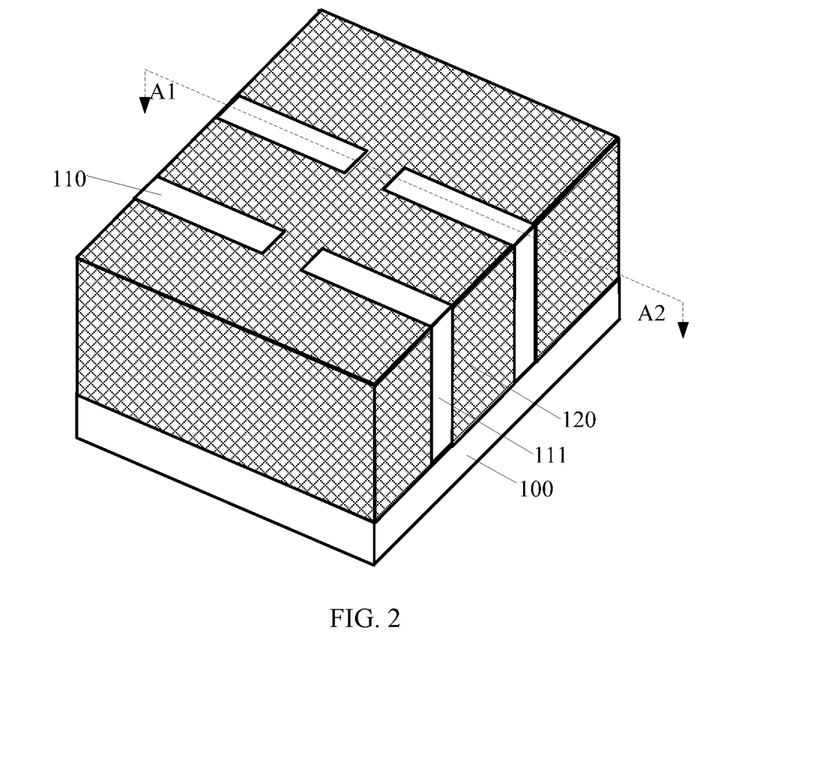
Figure 3:
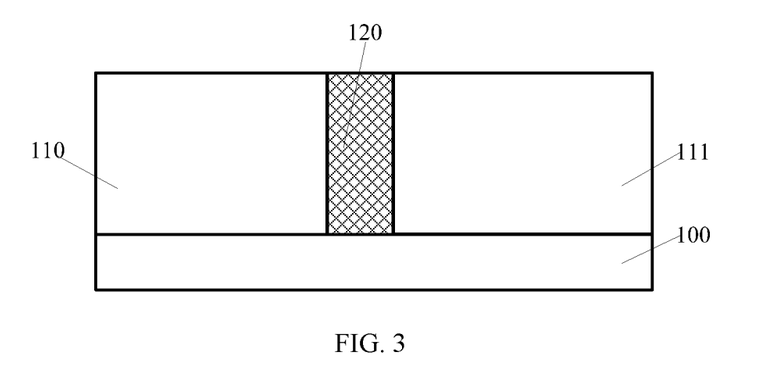

Referring to FIGS. 2-3, FIG. 3 is a cross-section view along the A1-A2 direction in FIG. 2. The isolation structure film 120 covers sidewalls of the first fins 110 and the second fins 111, which may be formed on the semiconductor substrate 100.

Figure 4:
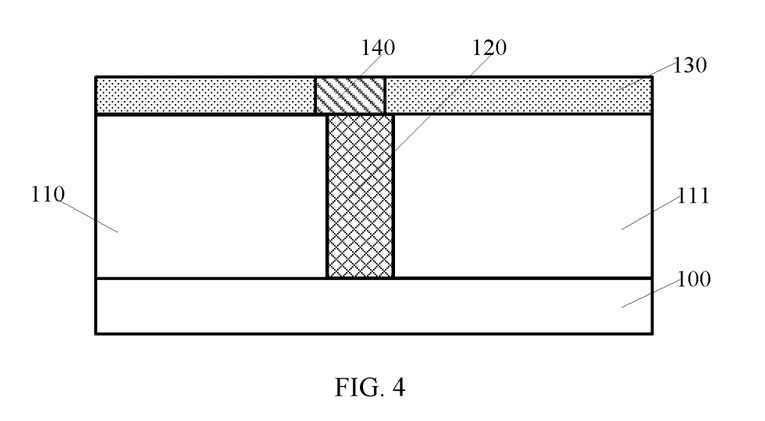

FIG. 4 illustrates a structure based on FIG. 3. As shown in FIG. 4, a mask layer 130 may be formed on the isolation structure film 120, the first fins 110 and the second fins 111. The mask layer 130 has an opening (not shown), which is over the isolation region. The size of the opening which is perpendicular to sidewalls of the opening is larger than the distance between the first fin 110 and the adjacent second fin 111. An isolation film 140 may be formed in the opening.

Figure 5:
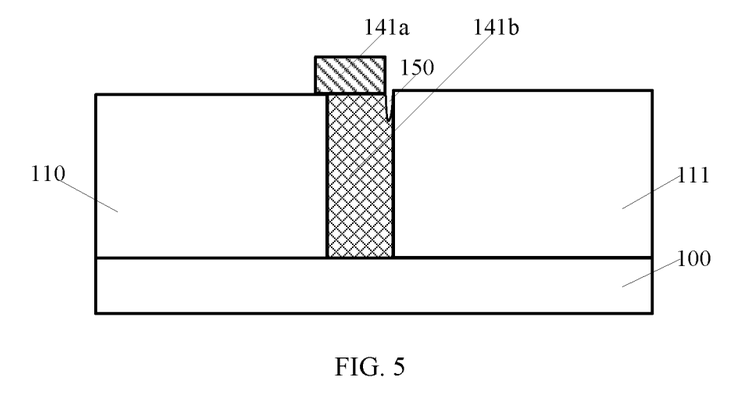

Referring to FIG. 5, after removing the mask layer 130 (referring to FIG. 4), isolation structures may be formed in the isolation structure film 120 between adjacent first fins 110 and between adjacent second fins 111 by etching back the isolation film 140 (referring to FIG. 4) and the isolation structure film 120. The isolation layer may include a first layer 141a formed from the isolation film 140 and a second layer 141b formed from the isolation structure film 120 between the first fin 110 and the adjacent second fin 111. The top surface of the isolation structures may be lower than the top surfaces of the first fins 110 and the second fins 111. The top surface of the first isolation layer 141a may be higher than the top surfaces of the first fins 110 and the second fins 111.

In the process for forming the mask layer 130, the opening and the isolation structure film 120 between the first fin 110 and the adjacent second fin 111 may be misaligned due to process limitations on the alignment accuracy of the photolithography process. The mask layer 130 may cover a portion of the isolation structure film 120 between the first fin 110 and the adjacent second fin 111. After forming the isolation film 140, the isolation film 140 may not cover the isolation structure film 120 between the first fin 110 and the adjacent second fin 111. After removing the mask layer 130, a portion of the isolation structure film 120 between the first fin 110 and the adjacent second fin 111 may be exposed. In the etch-back process of the isolation film 140 and the isolation structure film 120, the exposed isolation structure film 120 between the first fin 110 and the adjacent second fin 111 may be etched to form an opening 150 between the second fin 111 and the isolation layer 141, which may degrade the isolation performance of the isolation layer 141 and cannot meet requirements of the process.

The present disclosure provides a semiconductor device and its fabricating method. The method includes: forming a gate structure material layer on the semiconductor substrate and initial fins, where the top surface of the gate material layer is higher than the top surfaces of the initial fins; forming a trench in the gate structure material layer and the initial fins, which passes through the initial fins along a direction perpendicular to an extending direction of initial fins and in parallel with a surface of the semiconductor substrate, and passes through the plurality of initial fins to form fins; forming an isolation layer in the trench, where the top surface of the isolation layer is higher than the top surfaces of the fins; forming gate structures by etching the gate structure material layer. The method improves the isolation performance of semiconductor devices.

FIGS. 6-12 illustrate semiconductor structures corresponding to certain stages for forming an exemplary semiconductor device according to various disclosed embodiments of the present disclosure.

Figure 6:
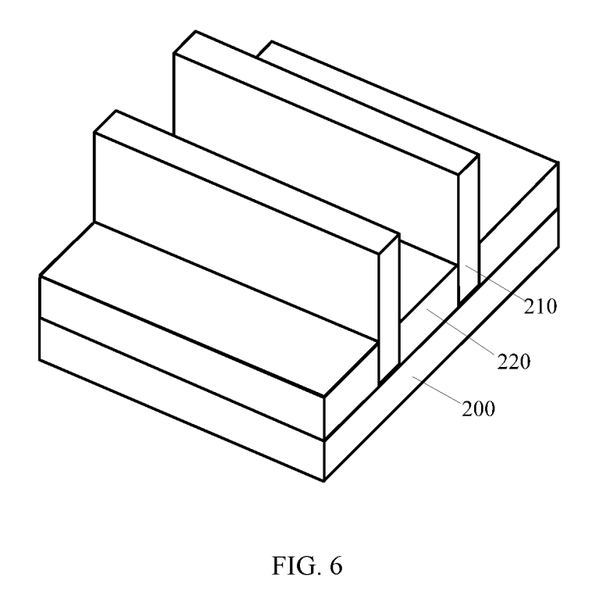
FIGS. 6-12 illustrate semiconductor structures corresponding to certain stages for forming an exemplary semiconductor device according to various disclosed embodiments of the present disclosure.

Referring to FIG. 6, a semiconductor substrate 200 with initial fins 210 on the semiconductor substrate 200 may be provided.

The semiconductor substrate 200 may provide a platform for forming the semiconductor device.

In various embodiments, the semiconductor substrate 200 may be made of semiconductor materials including single crystalline silicon. The semiconductor substrate 200 may be made of polycrystalline silicon and amorphous silicon. The semiconductor substrate 200 may further be made of semiconductor materials including germanium, SiGe, GaAs and/or any other suitable semiconductor material(s).

In one embodiment, the initial fins 210 may be formed by patterning the semiconductor substrate 200. In other embodiments, the initial fins 210 may be formed by: forming a fin material layer on the semiconductor substrate; and etching the fin material layer to form the initial fins.

One or more initial fins 210 may be formed on the semiconductor substrate 200. In an exemplary embodiment, two initial fins 210 may be formed, shown as an example in FIG. 6.

In one embodiment, when multiple initial fins 210 are included, the initial fins 210 on the semiconductor substrate 200 may be arranged as follows: the initial fins 210 are parallel to each other, and the direction for the initial fins 210 arrangement is perpendicular to an extending direction of the initial fins 210. In other embodiments, the arrangement of the initial fins on the semiconductor substrate may be set according to any suitable design needs.

Figure 7:
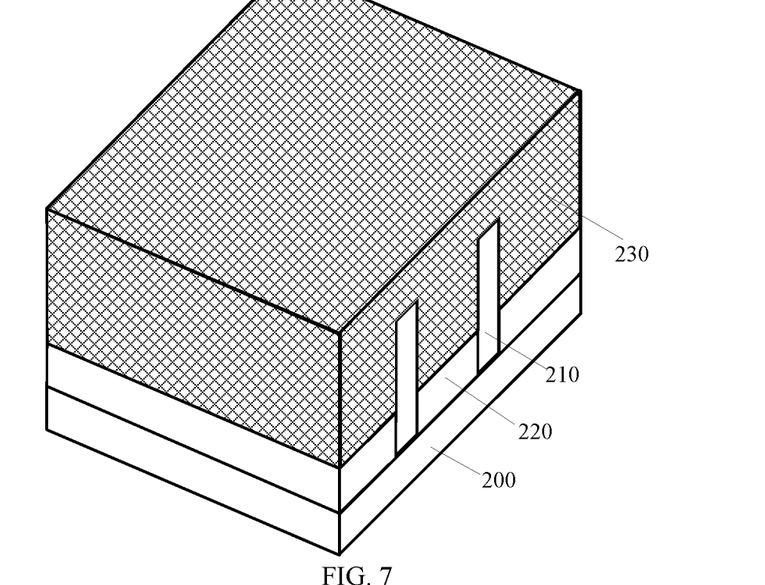

In one embodiment, before forming subsequent gate structure material layer, the process may further include: forming isolation structures 220 (e.g., as shown in FIG. 7) on the semiconductor substrate 200 to cover a portion of sidewalls of the initial fins 210. The isolation structures 220 have top surfaces lower than top surfaces of the initial fins 210.

The isolation structures 220 may electrically isolate adjacent initial fins 210 from each other.

The isolation structures 220 may be made of silicon dioxide, for example.

The method for forming isolation structures 220 includes: forming an isolation structure film (not shown) on the semiconductor substrate 220 and initial fins 210; planarizing the isolation structure film to remove the isolation structure film on the top surface of the initial fins 210; and after planarizing the isolation structure film, etching back the isolation structure film to form the isolation structures 220.

The isolation structure film may be formed by a deposition process. In one embodiment, the process for forming the isolation structure film is a flowable chemical vapor deposition process, which has better filling ability of the isolation structure film.

Referring to FIG. 7, a gate structure material layer 230 may be formed over the semiconductor substrate 200 and the initial fins 210. The gate structure material layer 230 has a top surface higher than top surfaces of the initial fins 210.

In one embodiment, the gate structure material layer 230 may be formed on the isolation structures 220 and the initial fins 210.

The gate structure material layer 230 includes a gate dielectric material layer on the semiconductor substrate 200 and the initial fins 210, and a gate material layer on the surface of the gate dielectric material layer.

For example, the gate dielectric material layer may be made of silicon dioxide; and the gate material layer may be made of polycrystalline silicon.

Then, a trench may be formed in the gate structure material layer 230 and the initial fins 210. The trench passes through the initial fins along a direction perpendicular to an extending direction of initial fins 210 and in parallel with a surface of the semiconductor substrate 200. As such, the initial fins 210 may be divided by the trenches to form fins from the initial fins 210.

In one embodiment, the method may further include: forming a mask layer on the gate structure material layer 230 before forming the trench. The mask layer has an opening. The gate structure material layer 230 and the initial fins 210 may be etched along the opening using the mask layer as a mask to form the trench.

Figure 8:
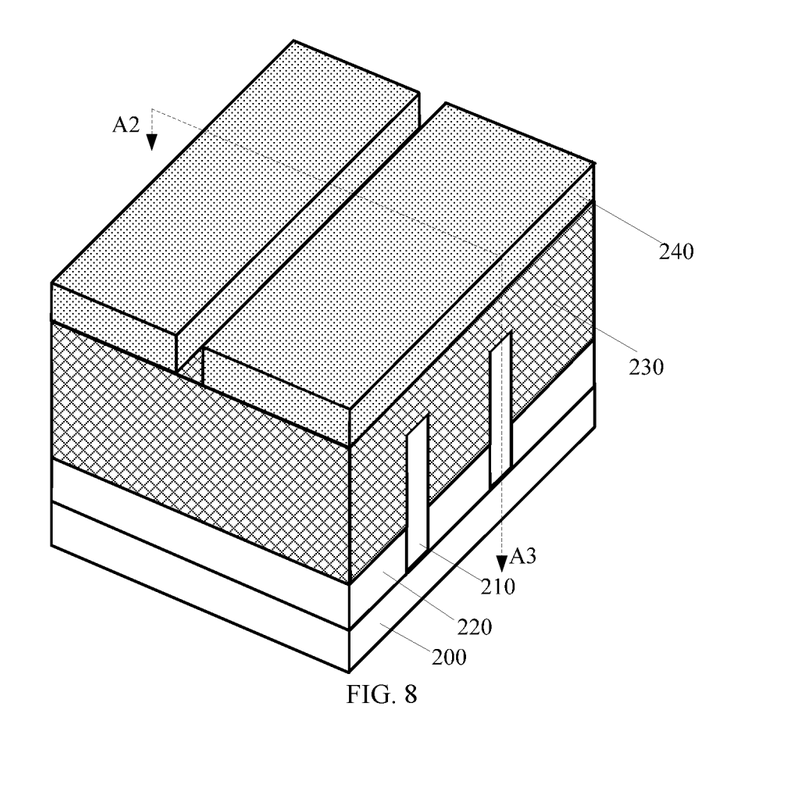
Figure 9:
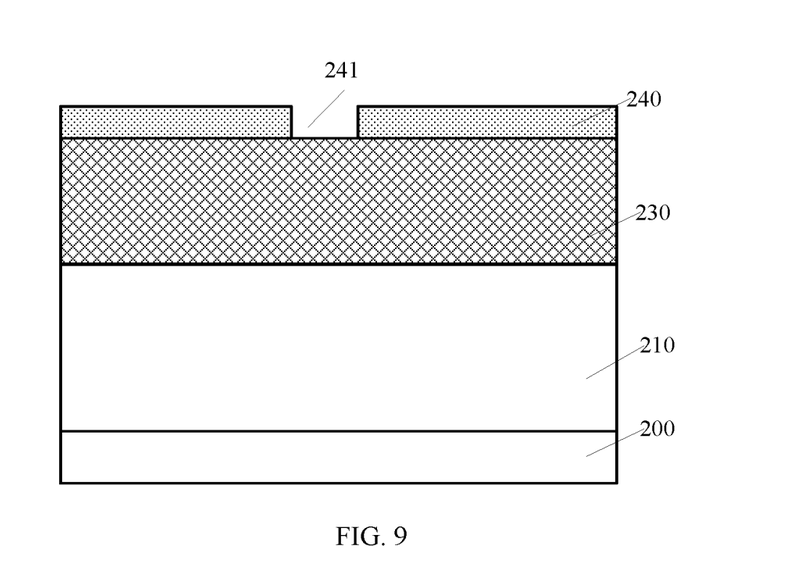

FIG. 8 illustrates a structure based on FIG. 7 and FIG. 9 is a cross-section view along the A2-A3 direction in FIG. 8. As shown in FIG. 8 and FIG. 9, a mask layer 240 with an opening 241 may be formed on the gate structure material layer 230.

In one embodiment, the method for forming the mask layer 240 includes: forming an initial mask layer on the gate structure material layer 230; forming a patterned photoresist layer on the initial mask layer, which defines the position of the opening 241; etching the initial mask layer using the patterned photoresist layer as a mask to form the mask layer 240; and removing the patterned photoresist layer.

In one embodiment, the initial mask layer is a multiple-layer structure including an initial organic mask layer on the gate structure material layer 230 and an initial bottom anti-reflective coating on the initial organic mask layer. Correspondingly, the mask layer 240 is a multiple-layer structure including an organic mask layer on the gate structure material layer 230 and a bottom anti-reflective coating on the organic mask layer.

The initial organic mask layer may facilitate the surface planarization.

In one embodiment, the initial bottom anti-reflective coating, which may be made of silicon containing hydrocarbon for example, is formed to increase exposure precision during the formation of the patterned photoresist layer, and transfer the pattern in the initial bottom anti-reflective coating to the initial organic mask layer.

In other embodiments, the initial mask layer is a single-layer structure. Correspondingly, the mask layer is a single-layer structure. For example, the initial mask layer may be made of silicon nitride or silicon oxynitride.

Figure 10:
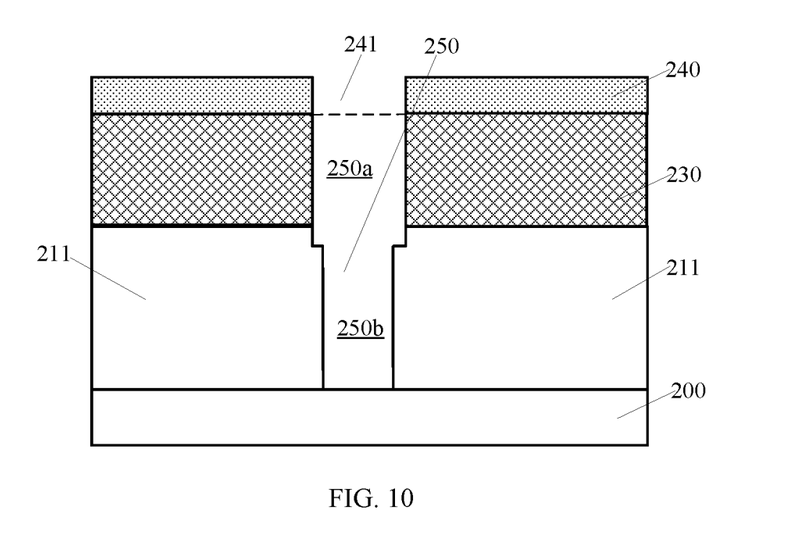

FIG. 10 illustrates a structure based on FIG. 9. As shown in FIG. 10, the gate structure material layer 230 and the initial fins 210 may be etched along the opening 214 using the mask layer 240 as a mask. The trench 250 may be formed in the gate structure material layer 230 and the initial fins 210 (referring to FIG. 9). The trench 250 passes through the initial fins 210 along a direction perpendicular to an extending direction of the initial fins 210 and in parallel with a surface of the semiconductor substrate 200, and passes through the plurality of the initial fins 210 to form the fins 211.

In one embodiment, the top size of the trench 250 is larger than its bottom size in the extending direction of the fins 211, which has the advantage of subsequent filling of the isolation film.

In other embodiments, the top size of the trench is less than or equal to its bottom size in the extending direction of the fins.

In one embodiment, the method for etching the gate structure material layer 230 and the initial fins 210 along the opening 214 using the mask layer 240 as a mask is described as the following: the first anisotropic dry etching may be used to etch the gate structure material layer 230 and the initial fins 210 along the opening 214 using the mask layer 240 as a mask, and then the initial trench may be formed in the gate structure material layer 230 and initial fins 210. After the first anisotropic dry etching, the second anisotropic dry etching may be used to etch the initial fins 210 at the bottom of the trench using the mask layer 240 as a mask, and then the trench 250 may be formed from the initial trench and the fins 211 may be formed from the initial fins 210. In one embodiment, the top size of the trench 250 is larger than its bottom size along the extending direction of the fins 211.

The top region of the trench 250 is referred to as a first trench region 250a, and the bottom region of the trench 250 is referred to as a second trench region 250b. The size of the first trench region 250a is larger than that of the second trench region 250b along the direction which is parallel to the extending direction of the fins 211.

In one embodiment, the first and second trench regions are of stepped shapes, where the difference between the top size and the bottom size is large which has the advantage of subsequent filling of the isolation film.

In one embodiment, in the first anisotropic dry etching process: gases may include $CH_4$, $CHF_3$, Ar and He; a flow rate of $CH_4$ may be 50 sccm to 200 sccm; a flow rate of $CHF_3$ may be 50 sccm to 300 sccm; a flow rate of Ar may be 200 sccm to 500 sccm; a flow rate of He may be 200 sccm to 500 sccm; a source radio frequency (RF) power may be 200 W to 1000 W; a bias voltage may be 200 V to 1000 V; and a chamber pressure may be 10 mtorr to 50 mtorr. In the second anisotropic dry etching process: gases may include $O_2$, $N_2$ and HBr; a flow rate of $O_2$ may be 3 sccm to 10 sccm; a flow rate of $N_2$ may be 10 sccm to 30 sccm; a flow rate of HBr may be 200 sccm to 500 sccm; a source RF power may be 500 W to 1000 W; a bias voltage may be 200 V to 700 V; and a chamber pressure may be 20 mtorr to 80 mtorr.

In the first and second anisotropic dry etching processes, byproducts may be produced. Regions which are covered by byproducts may be less etched by the first and second anisotropic dry etching processes. The byproducts from the first anisotropic dry etching process may accumulate at sidewall surfaces of the initial trench and edges of the bottom surface of the initial trench. The rate of generating byproducts in the second anisotropic dry etching process may be greater than the rate of generating byproducts in the first anisotropic dry etching process by adjusting parameters of the first and second anisotropic dry etching processes. The byproducts generated by the second anisotropic dry etching process may accumulate faster at the bottom edges of the initial trench, and the surface at the bottom edges of the initial trench covered by byproducts may increase larger, which may make stepped shapes of the first and second trench regions.

In other embodiments, parameters for the first and second anisotropic dry etching processes may be substantially same, and the processes may be performed continuously in a single, simplified step.

The isolation structure 220 may cover a portion of sidewalls of the fins 211.

In one embodiment, the trench 250 may expose top surfaces of the semiconductor substrate 200. In other embodiments, the bottom surface of the trench 250 may be higher than the top surface of the semiconductor substrate and lower than top surfaces of isolation structures, or the bottom surface of the trench may be higher than top surfaces of the isolation structures.

In one embodiment, the gate structure material layer 230, the initial fins 210, and the isolation structure 220 may be etched along the opening 214 using the mask layer 240 as a mask. The trench 250 may be in the isolation structure 220.

The opening 241 defines the position of the first trench region 250a which is higher than top surfaces of the fins 211 and the position of the second trench region 250b which is lower than top surfaces of the fins 211. The position of 250b which is lower than top surfaces of the fins 211 may do not need to be separately defined by a mask process which may reduce the fabrication cost for semiconductor devices.

The trench 250 and the initial fins 210 may be formed in different steps, and the depth of the trench 250 may be adjusted independently from the formation of the initial fins 210. The shallow depth of the trench 250 in the fins 211 may be avoided, and then the isolation performance of subsequent isolation layer may be improved.

Figure 11:
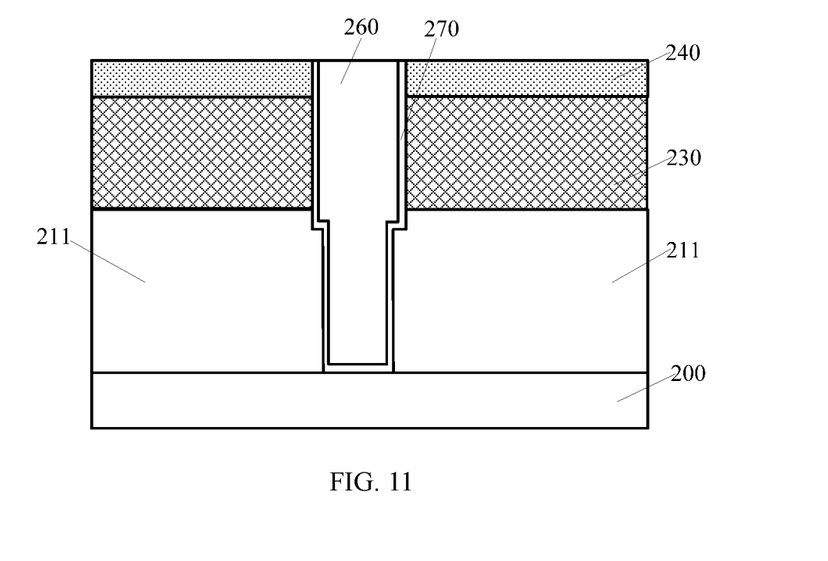

Referring to FIG. 11, the isolation layer 260 may be formed in the trench 250 (referring to FIG. 10) and top surface of the isolation layer may be higher than top surfaces of the fins 211.

For example, the isolation layer 260 may be made of silicon dioxide.

The method of forming the isolation layer 260 includes: forming an isolation film in the opening 241 and the trench 250, and on the mask layer 240; and forming the isolation layer 260 by planarizing the isolation film to expose the surface of the mask layer 240.

In one embodiment, the method may further include: before forming the isolation layer 260, forming a barrier layer 270 on sidewalls of the trench 250 and the opening 241, and the bottom of the trench 250. The isolation layer 260 may be located on the barrier layer 270.

The barrier layer 270 may be made of silicon nitride.

The barrier layer 270 may block the isolation layer 260 from oxidizing the fins 211 during the formation of the isolation layer 260 and avoid a large size change of the fins 211.

The thickness of the barrier layer 270 may be 5 Angstroms to 10 Angstroms. If the thickness of the barrier layer 270 is larger than 10 Angstroms, the space occupied by the barrier layer 270 in the trench 250 and the opening 241 may be large. The subsequent space for the isolation layer formation may be small and the performance of the isolation layer may be reduced. If the thickness of the barrier layer 270 is smaller than 5 Angstroms, the barrier layer 270 may have less protection on the fins 211.

Figure 12:
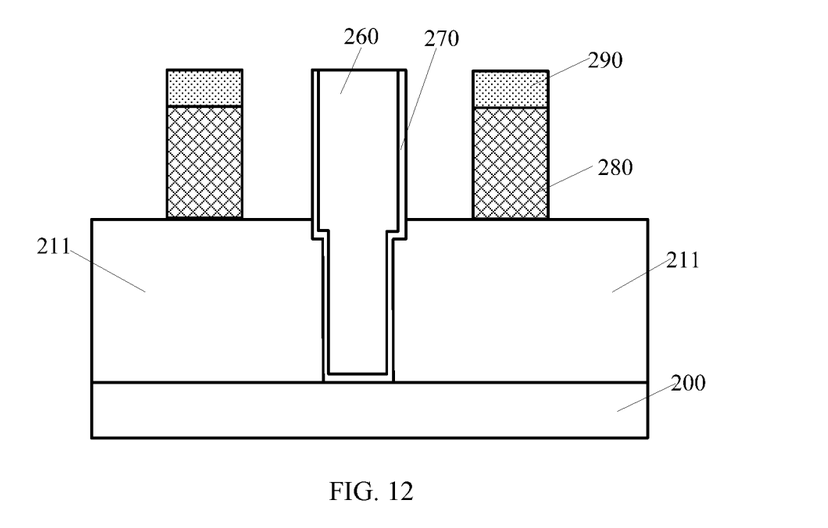
Figure 13:
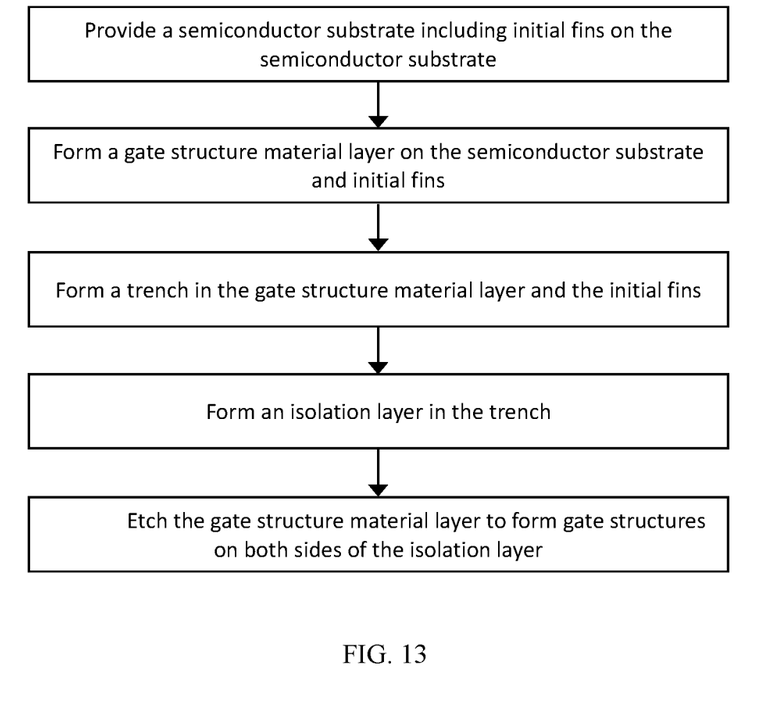
FIG. 13 illustrates an exemplary method for forming a semiconductor device according to various disclosed embodiments of the present disclosure.

Referring FIG. 12, after the formation of the isolation layer 260, the gate structures 280 on both sides of the isolation layer 260 may be formed by etching the gate structure material layer 230. The gate structures 280 may cross the fins 211 and cover a portion of sidewalls and a portion of top surfaces of the fins 211.

The isolation layer 260 and the gate structures 280 may be separated from each other.

In one embodiment, the method may further include: etching the mask layer 240 to form the gate protection layer 290 after forming the isolation layer 260 and before etching the gate structure material layer 230; etching the gate structure material layer 230 to form the gate structures 280 using the gate protection layer 290 as the mask. The gate protection layer 290 may be at the top of the gate structures 280.

The gate protection layer 290 may be made of silicon nitride or silicon oxynitride.

The gate structure material layer 230 may be on the isolation structure 220. After forming of the gate structures 280, the gate structures 280 may be also on the isolation structure 220.

In one embodiment, top surfaces of the isolation layer 260 may be higher than top surfaces of the gate structures 280. Top surfaces of the isolation layer 260 and the gate protection layer 290 may have similar heights. Correspondingly, there may be no need to form an additional gate structures on the isolation layer 260. Subsequently, the isolation layer and the gate structures 280 may be used to limit the formation of source/drain doped regions. There may be no need to use additional gate structures to limit the formation of source/drain doped regions.

In one embodiment, before forming the gate structure material layer 230, the isolation structure 220 covering a portion of sidewalls of the initial fins 210 may be formed on the semiconductor substrate 200. After forming the fins 211, the isolation structure 220 may cover a portion of sidewalls of the fins 211. After forming the isolation layer 260 in the trench 250, there may be no need to etch the isolation structure 220. It may avoid the loss of the isolation layer 260 because of the etching of the isolation structure 220 and improve the isolation performance of the isolation layer 260.

In one embodiment, the method may further include: forming the source/drain doped regions in the fins 211 on each side of the gate structure 280; and forming the source/drain doped regions in the fins 211 between the isolation layer 260 and the gate structure 280.

A process to form the source/drain doped regions may include: forming source/drain trenches in the fins 211 on sides of the gate structures 280; and forming source/drain doped regions in the source/drain trenches by an epitaxial growth process.

In one embodiment, the method may further include: forming the first spacers on the sidewalls of the gate structures 280 and the second spacers covering a portion of the fins 211 on the sidewalls of the isolation layer 260. The source/drain doped regions may be in the gate structures 280 and in the fins 211 on sides of the first spacers.

The first and second spacers may define the space for the source/drain doped regions, so the source/drain doped regions between the gate structures 280 and the isolation layer 260, adjacent to the gate structures 280 and adjacent to the isolation layer 260 may have uniform growth rates.

In one embodiment, the trenches in the gate structure material layer and between the fins may be formed in a one-single-step process, which may avoid misalignment between trenches higher than the top surfaces of the fins and trenches lower than the top surfaces of the fins. After forming the isolation layer in the trenches, the isolation layer which is higher than the top surfaces of the fins may cover the isolation layer which is lower than the top surfaces of the fins. This may improve the isolation performance and meet the requirements of the process design.

Next, the trenches may be formed in the gate structure material layer which may define the location for trenches. No additional material may be needed to define the trenches. After forming the isolation layer, no additional etching may be needed to remove the gate structure material layer. Subsequently, the process may be simplified with low cost.

This disclosure embodiment may also provide a semiconductor device using the above method, as illustrated in FIG. 12, including: a semiconductor substrate 200; the fins 211 on the semiconductor substrate 200; an isolation layer 260 in the fins 211; a gate structure 280 on both sides of the isolation layer 260; and the gate structures 280 crossing the fins 211 and covering a portion of top surfaces and sidewalls of the fins 211. The top surface of the isolation layer 260 may be higher than top surface of the fins 211. The isolation layer 260 may pass through the fins 211 along a direction perpendicular to an extending direction of the fins 211 and in parallel with a surface of the semiconductor substrate 200.

In a certain embodiment, FinFET device may be formed by self-aligned single diffusion break (SDB) process. For example, the gate structure material layer 230 (referring to FIG. 8) may include a poly a-Si, and the mask layer 240 (referring to FIG. 8) may include a silicon nitride hard mask.

In this case, after the deposition and the chemical mechanical planarization of the dummy poly a-Si, the silicon nitride hard mask deposition may be performed. Subsequently, the SDB and the dummy poly a-Si trench may be formed. The silicon nitride spacer may be formed with the subsequent the silicon dioxide deposition and the chemical mechanical planarization. The gate structures may be formed by etching the gate structure material layer and the epi process may be followed.

In the present disclosure, the trenches in the gate structure material layer and between the fins may be formed in a one-single-step process, which may avoid misalignment between trenches higher than the top surfaces of the fins and trenches lower than the top surfaces of the fins. After forming the isolation layer in the trenches, the isolation layer which is higher than the top surfaces of the fins may cover the isolation layer which is lower than the top surfaces of the fins. This may improve the isolation performance and meet the requirements of the process design.

In the present disclosure, the trenches may be formed in the gate structure material layer which may define the location for trenches. No additional material may be needed to define the trenches. After forming the isolation layer, no additional etching may be needed to remove the gate structure material layer. Subsequently, the process may be simplified with low cost.

In the present disclosure, a mask layer, which has an opening, may be formed on the gate structure material layer before forming the trench. The trench may be formed by etching the gate structure material layer and the initial fins along the opening using the mask layer as a mask. The opening defines the position of the first trench region which is higher than top surfaces of the fins and the position of the second trench region which is lower than top surfaces of the fins. The position of the second trench region which is lower than top surfaces of the fins may do not need to be separately defined by a mask process which may reduce the fabrication cost for semiconductor devices.

In the present disclosure, the trench and initial fins may be formed in different steps, and the depth of the trench may be adjusted independently from the formation of initial fins. The shallow depth of the trench in fins may be avoided, and then isolation performance of subsequent isolation layer may be improved.

In the present disclosure, before forming the gate structure material layer, the isolation structure covering a portion of sidewalls of the initial fins may be formed on the semiconductor substrate. After forming the fins, the isolation structure may cover a portion of sidewalls of the fins. After forming the isolation layer in the trench, there may be no need to etch the isolation structure. It may avoid the loss of the isolation layer because of the etching of isolation structure and improve the isolation performance of the isolation layer.

In the present disclosure, before forming the isolation layer, the barrier layer may be formed on sidewalls and the bottom of the trench. The barrier layer may block the isolation layer from oxidizing the fins during the formation of the isolation layer and avoid a large size change of the fins.

In the present disclosure, the isolation layer which is higher than the top surfaces of the fins may cover the isolation layer which is lower than the top surfaces of the fins. This may improve the isolation performance and meet the requirements of the process design.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device, comprising:
    a semiconductor substrate;
    fins on the semiconductor substrate;
    an isolation layer formed on the semiconductor substrate, wherein the isolation layer has a top surface higher than top surfaces of the fins, each of the fins is divided into two portions by the isolation layer, the isolation layer is located between the two portions of each of the fins and extends along a direction perpendicular to an extending direction of the fins and in parallel with a surface of the semiconductor substrate, and the isolation layer is made of a first material;
    a barrier layer formed on sidewalls and bottom of the isolation layer, wherein the barrier layer isolates the isolation layer from the fins and the semiconductor substrate, and the barrier layer is made of a second material different from the first material; and
    gate structures on sides of the isolation layer.

2. The semiconductor device according to claim 1, wherein:
    the isolation layer includes a first isolation portion and a second isolation portion below the first isolation portion.

3. The semiconductor device according to claim 2, wherein:
    the first isolation portion has a top width greater than a bottom width of the second isolation portion.

4. The semiconductor device according to claim 2, wherein:
    an interface plane between the first isolation portion and the second isolation portion is lower than the top surfaces of the fins.

5. The semiconductor device according to claim 2, wherein:
    a bottom of the first isolation portion completely covers a top of the first isolation portion.

6. The semiconductor device according to claim 1, wherein:
    the second material includes silicon nitride.

7. The semiconductor device according to claim 1, wherein:
    a thickness of the barrier layer is 5 Angstroms to 10 Angstroms.

8. The semiconductor device according to claim 1, wherein:
    the first material includes silicon dioxide.

9. The semiconductor device according to claim 1, wherein:
    each of the gate structures includes a gate dielectric material layer on the semiconductor substrate and the fins, and a gate material layer on the gate dielectric layer.

10. The semiconductor device according to claim 9, wherein:
    the gate dielectric material layer is made of a material including silicon dioxide; and
    the gate material layer is made of a material including polycrystalline silicon.

11. The semiconductor device according to claim 1, further including:

source/drain doped regions formed in the fins between the isolation layer and the gate structures.

\* \* \* \* \*